United States Patent [19]

Wong et al.

[11] Patent Number: 4,855,796
[45] Date of Patent: Aug. 8, 1989

[54] BEAM LEAD MIXER DIODE

[75] Inventors: Wah S. Wong, Montebello; Cheng P. Wen, Mission Viejo; Jen K. Kung, Rolling Hills, all of Calif.

[73] Assignee: Hughes Aircraft Company, Los Angeles, Calif.

[21] Appl. No.: 871,236

[22] Filed: Jun. 6, 1986

[51] Int. Cl.[4] ............... H01L 29/48; H01L 23/48; H01L 27/02

[52] U.S. Cl. ...................... 357/15; 357/47; 357/49; 357/69; 357/71; 156/656

[58] Field of Search ............ 357/15, 69, 71, 47, 357/49; 156/656

[56] References Cited

U.S. PATENT DOCUMENTS

| 3,836,988 | 9/1974 | Board | 357/69 |
| 4,301,233 | 11/1981 | Calviello | 156/656 |
| 4,499,656 | 2/1985 | Fabian et al. | 156/656 |
| 4,577,213 | 3/1986 | Bauhahn | 357/69 |

OTHER PUBLICATIONS anderson et al., "GaAs Beam Lead Antiparallel Diodes for mm Wave Subharmonic Mixers", pp. 688-691, IEDM 81.

Primary Examiner—Andrew J. James
Assistant Examiner—Ngan V. Ngo
Attorney, Agent, or Firm—Terje Gudmestad; Mark Meltzer

[57] ABSTRACT

A beam lead diode configuration is described, employing a planar proton bombarded conversion region and a low-permittivity dielectric separator. The diode enjoys the mechanical ruggedness of the conventional planar diodes and the electrical performance of conventional mesa-type diodes. The diode structure results in the absence of N-type mesa structures on the substrate, allowing fabrication by relatively low-cost, high-yield photolithographic processes.

12 Claims, 2 Drawing Sheets

BEAM LEAD MIXER DIODE

BACKGROUND OF THE INVENTION

1. Field of the Invention

The invention relates to Schottky diode structures, and more particularly to Schottky diode structures characterized by high cutoff frequencies, wide bandwidth and low parasitic reactance.

2. Description of the Related Art

The Schottky barrier mixer diode is widely used in ultra-broad bandwidth (on the order of 10 GHz or greater) millimeter-wave receivers beyond 100 GHz. Such mixer-down converters offer the combination of low cost, wide band-width, large dynamic range, good sensitivity and room temperature operation virtually unparalleled by alternative technology. However, the RF performance of the mixer circuit depends heavily on the electrical characteristics of the Schottky barrier diodes employed.

In a millimeter-wave balanced mixer, the diodes are preselected in matched pairs to minimize undesirable noise conversion from the local oscillator to the IF output. A mixer diode can be regarded as the combination of a nonlinear, voltage dependent series resistance and capacitance in parallel with a stray capacitance. The commonly used figure of merit of a Schottky mixer diode $f_{co}$ (cut-off frequency) is defined as $$f_{co} = (1/2 \, R_s C_o) \tag{1}$$

where $R_s$ is the series resistance of the Schottky diodes, $C_o$ is the total capacitance across the diode at zero volt applied bias, representing the sum of $C_{jo}$ and $C_{stray}$, where $C_{jo}$ is the depletion capacitance of the unbiased Schottky junction, and $C_{stray}$ is the parasitic capacitance between the electrodes of the diodes.

Normally, an external shunt inductance L is employed in a mixer circuit so that the capacitance and the inductance are in resonance at the midband frequency where the mixer exhibits minimum conversion loss. As the operating frequency moves away from the midband frequency, the RF performance of the mixer starts to deteriorate due to increasing impedance mismatch. It may be concluded from impedance matching considerations that the operating bandwidth of a mixer is inversely proportional to the product of the parasitic capacitance and the midband frequency.

In addition to the electrical performance parameters, physical integrity of a beam lead mixer diode is of high importance in actual millimeter-wave circuit applications. Circuit fabrication yield, mixer manufacturing cost and component survivability under extreme temperature cycling, vibration, and acceleration conditions are strongly dependent on the mechanical stability of the device measured in terms of bondability and beam lead pull strength. A number of device configurations are commonly used for beam lead mixer diodes.

One conventional configuration is the mesa-type beam lead GaAs Schottky mixer diode, wherein a low permittivity dielectric (dielectric constant lower than 12) beam lead support serves to minimize the stray capacitance between the beam lead and the mesa, resulting in high device cut-off frequency and low parasitic capacitance. However, this type of device is extremely fragile (the typical beam lead pull strength is less than 5 grams). Device characterization and mounting are found to be very difficult to accomplish even for skilled workers.

Another conventional configuration is the modified mesa-type beam lead diode, which employ a dielectric bridge to insulate the Schottky electrode from the N+ doped mesa. This diode has the same advantages as the regular mesa-type diode in its high device cut-off frequency and low parasitic capacitance. In addition, the beam leads which are anchored on the substrate are far more rugged than those attached to the dielectric (glass) support. Unfortunately, the thickness uniformity of the dielectric layer at the vertical walls of the mesa is not subject to tight processing control, resulting in wide variations of stray capacitance from one diode to another. Such device parameter non-uniformity is not acceptable for balanced mixer configurations. Moreover, the etched mesa, which is typically 3 microns in thickness, poses severe compatibility problems with the fine line photolithographic technique employed to define the typical 1 micron × 10 micron Schottky junction. Consequently, the processing yield of this type of diode is far from satisfactory. This device is also fragile, having a typical beam lead pull strength of less than 5 grams.

A truly planar mixer diode fabricated using a proton bombardment technique to provide isolation between the electrodes of Gallium Arsenide (GaAs) mixer diode devices is presently being marketed by the assignee of the present application. This configuration eliminates the dielectric beam lead support entirely, relying on a carefully controlled proton bombardment to destroy the crystalline structure over selected regions of the N+ surface region to convert these selected areas into non-conductive regions. This device configuration offers excellent performance uniformity, manufacturing yield, and mechanical integrity. However, the bombarded N+ regions are of relatively high permittivity, resulting in an increased parasitic capacitance.

SUMMARY OF THE INVENTION

It is therefore an object of this invention to provide a beam lead mixer diode with low parasitic capacitance and high cut-off frequency and yet have excellent mechanical integrity.

It is a further object of this invention to provide an improved beam lead mixer diode structure characterized by an absence of mesa N+ structures on the substrate surface to allow the use of high yield, fine-line photolithographic processes and the uniformity of device performance necessary for balanced mixer implementations.

A beam lead mixer diode characterized by high cut-off frequency, low parasitic reactance, mechanical stability and electrical performance uniformity is disclosed. The diode comprises a semi-insulating substrate layer, with an N+ layer heavily doped with N impurities to achieve a conductive layer on top of the substrate. A very thin active N layer is formed on the N+ layer. First and second conversion regions are formed in the N+ and N layers by selective proton bombardment of these layers, thereby damaging the crystalline structure of these regions and converting the regions to insulating regions. An ohmic metallization layer is formed in contact with the substrate and the N+ and N layers adjacent one conversion region. A first beam lead is formed over the ohmic metallization layer. A dielectric separator of low permittivity material is formed over a portion of the second conversion region. A Schottky contact is formed by a second metallization layer covering a portion of the N layer, the adjacent dielectric separator and the exposed portion of the conversion region to form a Schottky diode. A second beam lead is formed over a portion of the second metallization layer. The dielectric separator substantially reduces the parasitic stray capacitance between the second metallization layer and the conductive N+ layer, providing a beam lead diode with increased cut-off frequency, mechanical stability and uniform electrical characteristics.

BRIEF DESCRIPTION OF THE DRAWINGS

These and other features and advantages of the present invention will become more apparent from the following detailed description of an exemplary embodiment thereof, as illustrated in the accompanying drawings, in which.

DETAILED DESCRIPTION OF THE PREFERRED EMBODIMENT

Figure 1:
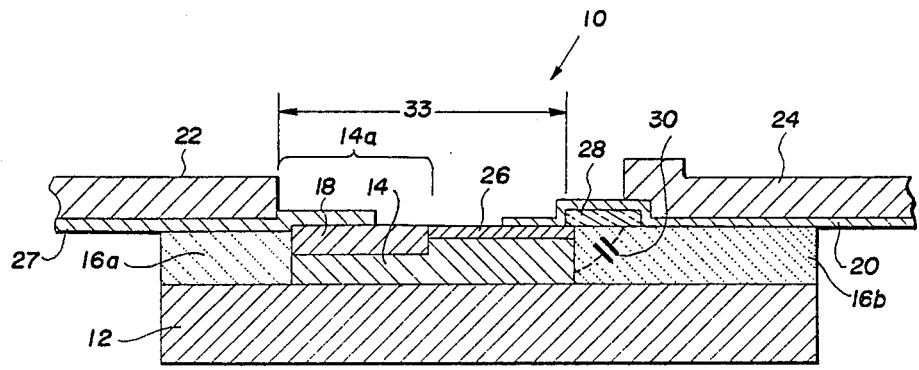
FIG. 1 is a cross-sectional view of a beam lead mixer diode structure embodying the invention.

A cross-sectional view of a planar beam lead mixer diode 10 employing a dielectric separator 28 in accordance with the invention is shown in FIG. 1. In this embodiment, the diode comprises a substrate 12, comprising a semiinsulating Cr-doped Gallium Arsenide layer. A thin, heavily doped N+ epitaxial layer 14 having a thickness of about 3 microns is grown on the top surface of the substrate 12. A very thin N-doped active epitaxial layer 26, having a thickness of 0.1 to 0.2 microns, is in turn grown on top of the layer 14.

Conversion regions 16a and 16b, whose lateral extents are defined by appropriate photolithographic masking techniques, are produced in the two layers 14 and 26 by a carefully controlled high energy proton bombardment of the structure. This bombardment damages the crystalline atomic structure of the N+ and N layer regions, thereby converting the bombarded regions of the conductive N+ layer region 14 and the N-doped layer 26 into nonconductive regions 16a and 16b, thereby defining the active diode region whose lateral extent is indicated by reference numeral 33. The depth of the N+ layer 14 and the N layer 26 and the proton bombardment parameters are cooperatively selected to ensure that the protons penetrate to the bottom of the layer 14. Otherwise, a thin conductive layer would remain, creating a significant stray capacitance which would limit the frequency cut-off and bandwidth of the resulting diode.

An ohmic contact 18 is formed in contact with region 14a of the N+ layer 14 and the N layer 26. A thin dielectric separator 28 is fabricated on top of a portion of the conversion region 16b adjacent the active region 33, and preferably overlapping onto the active region 33 by one to two microns. The dielectric separator 28 is preferably of a thickness in the range of 0.2 to 2.0 microns.

The Schottky contact comprises metallization layer 20 which is in turn formed on N layer 26. The metallization layer 20 is fabricated so as to extend over the separator 28 and over the portion of the conversion region 16b not covered by the dielectric separator 28. A gold beam lead 24 is plated to the top of the metallization layer 20.

Another metallization layer 27 is formed over the ohmic contact 18 and the conversion region 16a. Another gold beam lead 22 is plated over the metallization layer 27. Electrical contact to the diode is made via the beam leads 22 and 24.

The dielectric separator 28 is fabricated from a low permittivity material preferably having a permittivity less than six, such as silicon dioxide, and the thickness of the separator 28 serves to separate the metallization layer 20 from the conductive N+ region 14. The separation distance coupled with the low permittivity of the separator 28 and the overlapping of the separator 28 over the active region substantially reduces the stray capitance between the highly conductive N+ region 14 and the metallization layer 20. This capacitance is indicated by capacitance 30 in FIG. 1.

The reduction in the stray capacitance achieved by the diode configuration of FIG. 1 results in a typical increase by a factor of 50 to 100 percent of the frequency bandwidth of the diode over conventional planar beam lead diodes fabricated with proton bombardment. This substantial improvement in the electrical performance is achieved without significant degradation of the mechanical stability of the diode, since the gold-plated beam lead 24 connected to the Schottky diode is still substantially supported by the proton bombarded conversion region 16b. As a result, the invention provides a diode having the electrical performance characteristics of the conventional mesa-type beam lead diode with dielectric beam supports, yet with the performance uniformity and mechanical stability of the conventional planar Schottky device. Moreover, diodes embodying the invention may be fabricated by relatively low-cost, high-yield processes.

Figure 2A:
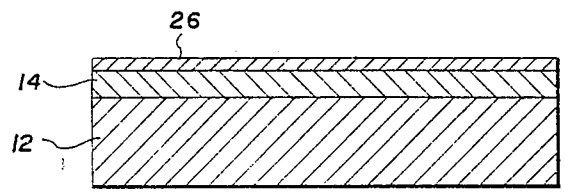
FIG. 2A–2F are cross-sectional depictions of the structures resulting from steps of an exemplary process for fabricating a beam lead mixer diode embodying the invention.

FIGS. 2A–2F sequentially illustrate the structures (in cross-section) resulting from steps of an exemplary process for fabricating one beam lead mixer diode embodying the invention. FIG. 2A illustrates the basic epitaxial device structure. In this embodiment, layer 12 is Cr-doped GaAs to form the semi-insulating substrate, typically about 250 microns in thickness. N+ contact layer 14 is an epitaxial layer of GaAs with a concentration of $2 \times 10^{18}$ impurity ions per cubic centimeter, and a typical thickness of 2 to 3 microns. N layer 26 formed on layer 14 is an epitaxial layer of GaAs doped with a concentration of $10^{17}$ impurity ions per cubic centimeter, and a thickness of 0.1 to 0.2 microns.

It will be appreciated that FIGS. 2A–2F are not drawn to scale, and that the structure shown in these figures may be replicated throughout a GaAs wafer to form many diodes on the wafer in one sequence of processing steps. The diode structures may then be separted to form individual diodes.

Figure 2B:
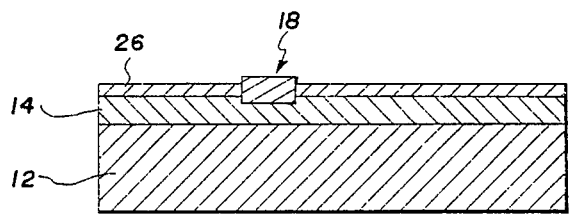

FIG. 2B illustrates the disposition of alloyed ohmic contact 18, which penetrates the N layer 26 to contact the conductive N+ layer 14. The contact 18 may comprise an Au-Ge-Ni alloy, having a thickness of about 1.5 microns.

Figure 2C:
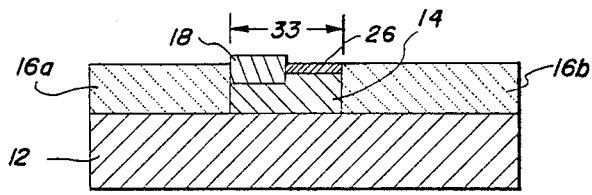

FIG. 2C illustrates the conversion regions 16a and 16b formed in the layers 14 and 26 by proton bombardment. A suitable photoresist mask (not shown) protects the diode region generally indicated by reference numeral 33 against the bombardment, which employs protons with an energy level of about 400 KeV. The parameters of the bombardment are selected in cooperation with the thickness of layers 26 and 14 so that protons penetrate the entire thickness of layers 26 and 14. The conversion regions 16a and 16b border the diode active region whose lateral extent is indicated by reference numeral 33 in FIG. 2C.

Figure 2D:
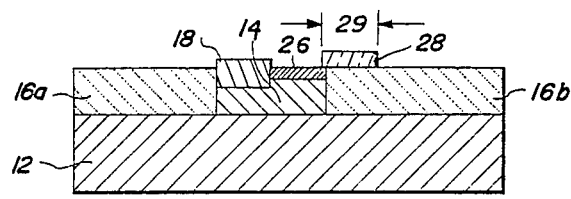
Figure 2E:
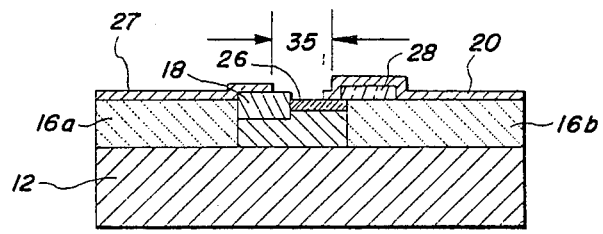
Figure 2F:
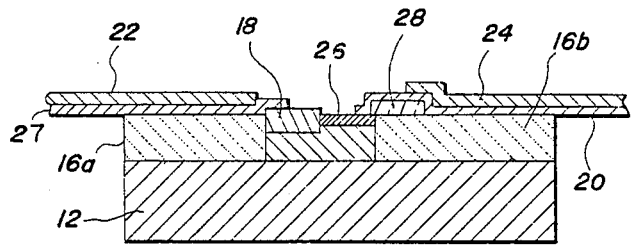

In the next step, a dielectric separator 28 is formed on the surface of the conversion layer 16b. The dielectric separator preferably comprises silicon dioxide formed to a thickness of 2.0 microns. The lateral extent 29 of the separator 28 is defined in the conventional manner by an opening in a layer of photoresist (not shown) which has been selectively etched in the photoresist. A typical lateral dimension for the separator is 5 to 10 microns. The silicon dioxide separator 28 is formed by planar enhanced deposition or sputtering techniques. The resulting structure is shown in FIG. 2D.

Once the dielectric separator has been formed, a Schottky metallization layer is applied to the structure to form layers 27 and 20. A gap 35 is formed between the metallization layers, and is typically about 15 microns in width. The gap is covered by a photoresist layer (not shown) during the metallization processing, and then removed to define the gap. The layer 27 is in electrical contact with the ohmic contact 18. The layer 20 forms a Schottky contact with the N layer 26, and is formed over the dielectric separator 28. Layers 27 and 20 have a typical thickness in the range of 4500 to 5000 Angstroms.

Once the metallization layers 27 and 20 have been formed, gold beam leads 22 and 24 are plated over portions of the layers 27 and 20 with a typical thickness of 10 microns. The structure then undergoes a wafer thinning procedure, typically a back etch process, to reduce the thickness of the substrate 12 to about 1.5 mils and to reduce the lateral extent of the substrate 12 and conversion regions 16a and 16b. The various diode structures which have been replicated on the wafer may then be separated to form individual diode devices.

It is understood that the above-described embodiment is merely illustrative of one of the many possible specific embodiments which may represent principles of the present invention. Other arrangements may be devised in accordance with these principles by those skilled in the art without department from the scope of the invention.

What is claimed is:

1. A beam lead diode which comprises:
   a semi-insulating substrate;
   an N+ layer heavily doped with N impurities to achieve a conductive layer on said substrate layer;
   an N layer formed on said N+ layer;
   first and second semi-insulating conversion regions formed in said N+ and N layers by proton bombardment of said layers, defining a diode region of said N+ and N layers having at least two side edges between said conversion regions;
   an ohmic contact formed on a first portion of said diode region adjacent said first conversion region;
   a first metallization layer formed over a portion of said ohmic contact and said first conversion region;
   a first beam lead supported by said first semi-insulating conversion region and formed on said first metallization layer and spaced from one side edge of said diode region to provide a first diode lead;
   a second metallization layer formed over a portion of said N layer adjacent said second semi-insulating conversion region, forming a Schottky contact;
   a dielectric separator piece located on a portion of said second semi-insulating conversion region under a portion of said second metallization layer adjacent said active diode region for increasing the separation between said Schottky contact and said N+ layer in the region adjacent said second semi-insulating conversion region; and
   a second beam lead supported by said second semi-insulating conversion region and formed on said second metallization layer and spaced from the other side edge of said diode region to provide a second diode lead.

2. The diode of claim 1 wherein said dielectric separator piece has a substantially rectangular shape across its lateral extent and is about 5 to 10 microns wide.

3. The diode of claim 2 wherein said dielectric separator piece is of a material having a dielectric permittivity less than six.

4. The diode of claim 3 wherein said dielectric separator piece material is silicon dioxide having a thickness in the range of 0.2 microns to 2.0 microns.

5. The diode of claim 2 wherein said dielectric separator piece overlaps said active region by a distance of one to two microns.

6. A beam lead diode characterized by a relatively high cutoff frequency and low parasitic reactance which comprises:
   a semi-insulating substrate layer;
   an N+ layer heavily doped with N impurities to achieve a conductive layer on said substrate layer;
   an N layer formed on said N+ layer;
   first and second conversion regions formed in said N+ and N layers by proton bombardment of said layers, defining a diode region of said N+ and N layers having side edges between said conversion regions;
   an ohmic contact formed on a first portion of said diode region adjacent said first conversion region;
   a first metallization layer formed over a portion of said ohmic contact and said first conversion region;
   a first beam lead supported by said first conversion region and formed on said first metallization layer and spaced from one side edge of said diode region to provide a first diode lead;
   a dielectric separator piece about 5 to 10 microns wide formed of low permittivity material over a portion of said second conversion region adjacent said diode region;
   a second metallization layer formed over a portion of said N layer adjacent said conversion region, said dielectric separator piece and said second conversion region to form a Schottky contact; and
   a second beam lead supported by said second conversion region and formed on said second metallization layer and spaced from the other side edge of said diode region to provide a second diode lead.

7. The diode of claim 6 wherein said dielectric separator piece comprises a material having a dielectric permittivity less than six.

8. The diode of claim 7 wherein said dielectric separator piece comprises a layer of silicon dioxide having a thickness in the range of 0.2 to 2.0 microns.

9. The diode of claim 7 wherein said dielectric separator piece extends over said diode region a distance of one to two microns.

10. a beam lead diode which comprises:
    a semi-insulating substrate;
    an N+ layer heavily doped with N impurities to achieve a conductive layer on said substrate layer;
    an N layer formed on said N+ layer;

first and second semi-insulating conversion regions formed in said N+ and N layers by proton bombardment of said layers, defining a diode region of said N+ and N layers having side edges between said conversion regions;

an ohmic contact formed on a first portion of said diode region adjacent said first conversion region;

a first metallization layer formed over a portion of said ohmic contact and said first conversion region;

a first beam lead supported by said first semi-insulating conversion region and formed on said first metallization layer and spaced from one side edge of said diode region to provide a first diode lead;

a second metallization layer formed over a portion of said N layer adjacent said second semi-insulating conversion region and over said second conversion region, forming a Schottky contact;

a dielectric separator piece having a substantially rectangular lateral cross-sectional shape located on a portion of said second semi-insulating region under a portion of said second metallization layer and overlapping said active diode region by a distance of one to two microns for increasing the separation between said Schottky contact and said N+ layer in the region adjacent said second semi-insulating conversion region thereby reducing the parasitic reactance between said second metallization layer and said N+ layer comprising said active diode region; and a second beam lead supported by said second semi-insulating conversion region and formed on said second metallization layer and spaced from the other edge of said diode region to provide a second diode lead.

11. The diode of claim 10 wherein said dielectric separator piece is about 5 to 10 microns wide.

12. The diode of claim 11 wherein said dielectric separator piece is about 0.2 to 2 microns thick.

* * * * *